(12) United States Patent
Jung et al.

(10) Patent No.: US 8,625,376 B2
(45) Date of Patent: Jan. 7, 2014

(54) SEMICONDUCTOR MEMORY DEVICE AND METHOD OF OPERATION THE SAME

(75) Inventors: Min Joong Jung, Gyeonggi-do (KR); Wan Seob Lee, Gangwon-do (KR); Jung Mi Shin, legal representative, Gyeonngi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 89 days.

(21) Appl. No.: 13/286,595

(22) Filed: Nov. 1, 2011

(65) Prior Publication Data
US 2012/0281488 A1    Nov. 8, 2012

(30) Foreign Application Priority Data
Nov. 2, 2010    (KR) .......................... 10-2010-0108149

(51) Int. Cl.
*G11C 7/00*    (2006.01)
*G11C 7/10*    (2006.01)

(52) U.S. Cl.
USPC ............... 365/222; 365/189.011; 365/189.14; 365/189.17

(58) Field of Classification Search
USPC ....................................................... 365/222
See application file for complete search history.

(56) References Cited

U.S. PATENT DOCUMENTS

| | | | | |
|---|---|---|---|---|
| 6,094,701 | A * | 7/2000 | Mochizuki et al. | 711/5 |
| 6,738,288 | B2 * | 5/2004 | Kawamura et al. | 365/185.11 |
| 6,922,359 | B2 * | 7/2005 | Ooishi | 365/185.16 |
| 6,963,502 | B2 * | 11/2005 | Park | 365/185.11 |
| 7,295,470 | B2 * | 11/2007 | Park et al. | 365/185.12 |
| 7,499,322 | B2 * | 3/2009 | Lee et al. | 365/185.08 |
| 7,941,586 | B2 * | 5/2011 | Kim | 711/103 |
| 8,369,163 | B2 * | 2/2013 | Song | 365/189.17 |
| 2005/0172086 | A1 * | 8/2005 | Kawai | 711/154 |

FOREIGN PATENT DOCUMENTS

| KR | 1020080095592 | 10/2008 |
|---|---|---|
| KR | 1020090068616 | 6/2009 |

OTHER PUBLICATIONS

Notice of Allowance issued from the Korean Intellectual Property Office on Apr. 30, 2012.
Office Action issued from the Korean Intellectual Property Office on Jan. 31, 2012.

* cited by examiner

*Primary Examiner* — Son Mai
(74) *Attorney, Agent, or Firm* — IP & T Group LLP

(57) ABSTRACT

A semiconductor memory device includes a first plane and a second plane each configured to include a plurality of memory cells, and a data transfer circuit configured to transfer first data, stored in the memory cells of the first plane, to the second plane and transfer second data, stored in the memory cells of the second plane, to the first plane when a copyback operation is performed and to transfer the first data or the second data to an I/O circuit when a read operation is performed.

12 Claims, 4 Drawing Sheets

SEMICONDUCTOR MEMORY DEVICE AND METHOD OF OPERATION THE SAME

CROSS-REFERENCE TO RELATED APPLICATION

Priority to Korean patent application number 10-2010-0108149 filed on Nov. 2, 2010, the entire disclosure of which is incorporated by reference herein, is claimed.

BACKGROUND

Exemplary embodiments relate to a semiconductor memory device and, more particularly, to a semiconductor memory device having a multi-plane structure.

A semiconductor memory device may perform a copyback program operation. The copyback program operation is an operation for reading data of a specific page included in a plane and programming the read data in another page of the specific plane or in another plane. In other words, data of a specific page is copied and stored.

In a conventional semiconductor memory device, data is not transferred between a group of planes forming a memory block when an operation, such as copyback, is performed. Instead, the data must be transferred through an external controller to store the data in another plane. If data is transferred through an external controller, the controller includes cache memory for storing the data read from a memory cell. Also, the time taken to perform the copyback operation through an external controller is longer than if the method was performed within a chip.

BRIEF SUMMARY

According to exemplary embodiments, data can be transferred between planes within a memory chip by changing a data I/O path.

A semiconductor memory device according to an aspect of the present disclosure includes a first plane and a second plane each configured to include a plurality of memory cells, and a data transfer circuit configured to transfer first data, stored in the memory cells of the first plane, to the second plane and transfer second data, stored in the memory cells of the second plane, to the first plane when a copyback operation is performed and to transfer the first data or the second data to an I/O circuit when a read operation is performed.

A semiconductor memory device according to another aspect of the present disclosure includes a first plane and a second plane each configured to include a plurality of memory cells, a first page buffer group configured to include a plurality of page buffers for temporarily storing data to be stored in the memory cells of the first plane and data read from the memory cells of the first plane, a second page buffer group configured to include a plurality of page buffers for temporarily storing data to be stored in the memory cells of the second plane and data read from the memory cells of the second plane, and a data transfer circuit configured to transfer a first data, outputted from the first page buffer group, to the second page buffer group to store the first data, stored in the memory cells of the first plane, in the second plane and to transfer a second data, outputted from the second page buffer group, to the first page buffer group to store the second data, stored in the memory cells of the second plane, in the first plane.

A method of operating a semiconductor memory device according to yet another aspect of the present disclosure includes reading data, stored in the memory cells of a first plane, while increasing a page column address of the first plane in response to a read command, outputting the data to a data line in response to data output signal generated using a read enable clock signal, transferring the data to a second plane in response to a data input signal generated using the read enable clock signal, and storing the transferred data in the memory cells of the second plane in response to a program command.

A method of operating a semiconductor memory device according to further yet another aspect of the present disclosure includes storing data, stored in the memory cells of a first plane, in the page buffers of the first plane while increasing the page column address of the first plane in response to a read command, transferring the data to a data line in response to a data output signal generated using a read enable clock signal, transferring the data to the page buffers of a second plane in response a data input signal generated using the read enable clock signal, storing the data in the page buffers of the second plane while increasing the page column address of the second plane, and storing the data of the page buffers of the second plane in the memory cells of the second plane in response to a program command.

An inter plane copy back current path generating circuit according to further yet another aspect of the present disclosure includes a global data line node, and a first, a second, and a third switching unit, each one end of which configured to be coupled with the global data line node, wherein the first and the third switching unit are activated when a read operation is performed, and the first and the second switching unit are activated when an inter plane copy back operation is performed.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
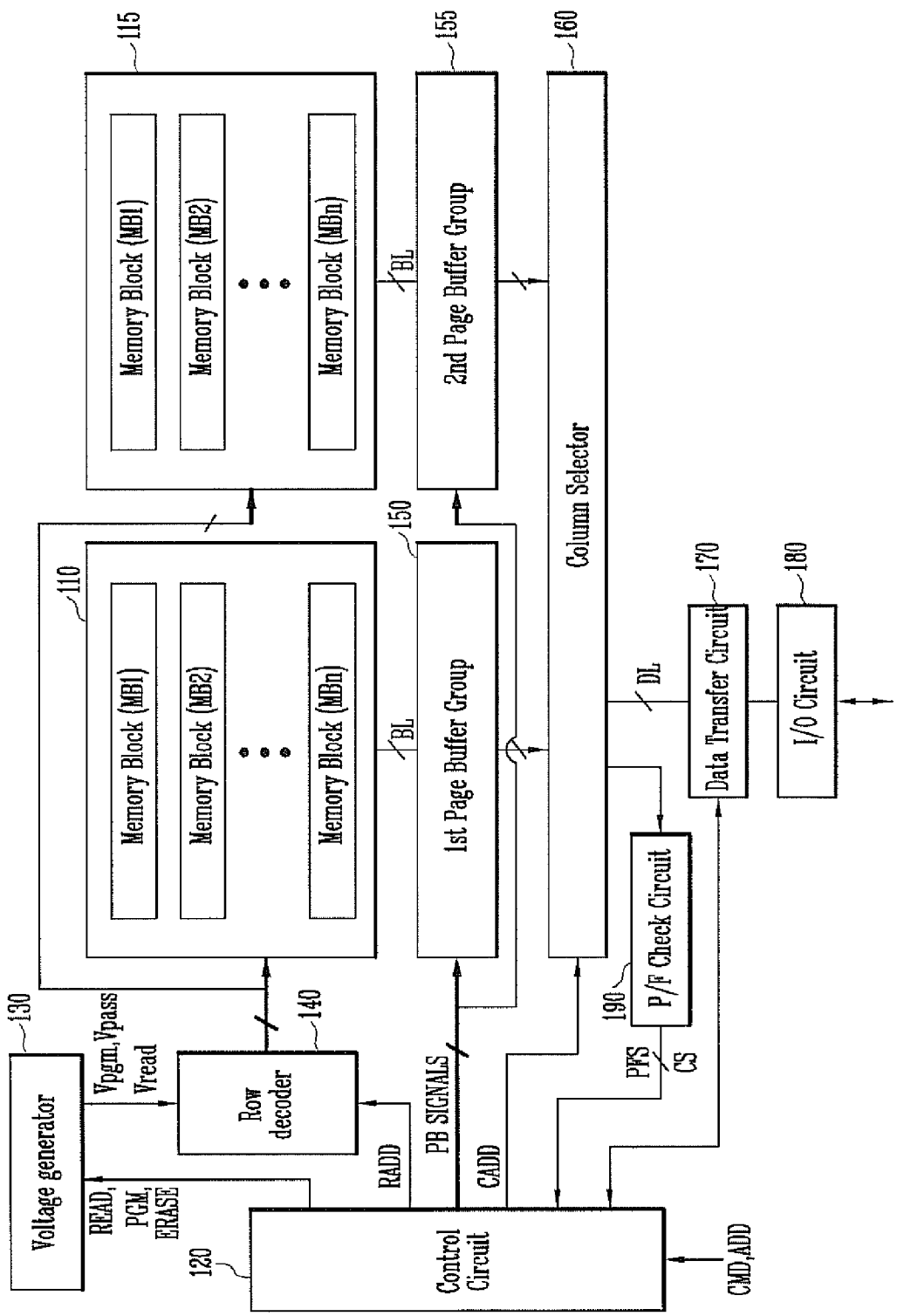
FIG. 1 is a circuit diagram illustrating the construction of a semiconductor memory device according to an exemplary embodiment of this disclosure.

FIG. 1 is a circuit diagram illustrating the construction of a semiconductor memory device according to an exemplary embodiment of this disclosure.

The semiconductor memory device according to the exemplary embodiment of this disclosure includes first plane and second planes 110 and 115, first and second page buffer groups 150 and 155, and a data transfer circuit 170. A voltage generator 130, a row decoder 140, a column selector 160, an I/O circuit 180, and a pass/fail (P/F) check circuit 190 may be further included as an operation circuit group.

Each of the first and the second planes 110 and 115 includes a plurality of memory blocks MB1 to MBn.

Each of the memory blocks includes a plurality of strings. Each string includes a source select transistor having a source coupled to a common source line, a plurality of memory cells, and a drain select transistor having a drain coupled to a bit line. The gate of the source select transistor is coupled to a source select line, the gates of the memory cells are coupled to respective word lines, and the gate of the drain select transistor is coupled to a drain select line. The strings are coupled to respective bit lines and are coupled to the common source line.

The first page buffer group 150 and the second page buffer group 155 drive the first plane 110 and the second plane 115, respectively. Accordingly, the first plane 110 and the second plane 115 can perform a program operation, an erase operation, a read operation, etc. by means of the first and the second page buffer groups 150 and 155.

Each of the first and the second page buffer groups 150 and 155 includes page buffers (not shown) coupled to the respective bit lines. Each of the first and second page buffer groups 150 and 155 also supplies voltage useful to store data in memory cells in the bit lines in response to control signals PB SIGNALS generated by a control circuit 120.

More specifically, each of the first and the second page buffer groups 150 and 155 precharges the bit lines when a program operation, an erase operation, or a read operation for memory cells is performed. Otherwise, each of the first and the second page buffer groups 150 and 155 latches data corresponding to the threshold voltage of relevant memory cells that are detected according to a change in the voltages of the bit lines. In other words, each of the first and the second page buffer groups 150 and 155 controls the voltages of the bit lines according to data stored in the memory cells and detects data stored in the memory cells.

The data transfer circuit 170 transmits data outputted to an external circuit from the first and the second page buffer groups 150 and 155 and transmits data from an external circuit to the first and the second page buffer groups 150 and 155.

More particularly, the data transfer circuit 170 transfers data from an external circuit, which is received from the I/O circuit 180, to the column selector 160 under the control of the control circuit 120 to input the data from an external circuit to the first and the second page buffer groups 150 and 155 when a program operation is performed. When the column selector 160 sequentially transfers the received data to the page buffers of the first and the second page buffer groups 150 and 155, the page buffers store the received data in their latches. Furthermore, when a read operation is performed, the data transfer circuit 170 transfers data, which is received from the page buffers of the first and the second page buffer groups 150 and 155 via the column selector 160, to the I/O circuit 180 to output the data to an external circuit.

The control circuit 120 internally generates a program operation signal PGM, a read operation signal READ, or an erase operation signal ERASE in response to a command signal CMD. The control circuit 120 also generates the control signals PS SIGNALS that control the page buffers of the first and the second page buffer groups 150 and 155 according to which type of the operation is being performed by semiconductor memory device.

Furthermore, the control circuit 120 internally generates a row address signal RADD and a column address signal CADD in response to an address signal ADD. Furthermore, the control circuit 120 checks whether the threshold voltages of selected memory cells have risen to a minimum threshold voltage based on a check signal CS that is generated by the P/F check circuit 180 during a program verification operation, and the control circuit 120 determines whether to perform a program operation again or to finish the program operation based on a result of the check signal CS.

The operation circuit group supplies an operation voltage to the first and the second planes 110 and 115 so that the program data of the first and the second page buffer groups 150 and 155 may be stored in the memory cells of the first and the second planes 110 and 115, or data stored in the memory cells of the first and the second planes 110 and 115 may be outputted to the first and the second page buffer groups 150 and 155.

The voltage supply circuit includes the voltage generator 130 and the row decoder 140. The voltage supply circuit (130 and 140) supplies operation voltages for the program operation, the erase operation, or the read operation of the memory cells. The operation voltages are supplied to the drain select line, the word lines, and the source select line of a selected memory block in response to the signals READ, PGE, ERASE, and RADD of the control circuit 120.

The voltage generator 130 outputs the operation voltages for program, read, or erasing the memory cells to global lines in response to the operation signals PGM, READ, and ERASE, which are the internal command signals of the control circuit 120. The voltage generator 130 outputs the operation voltages (for example, Vpgm, Vpass, and Vread) to the global lines according to the operation signals from the control circuit 120.

The row decoder 140 transfers the operation voltages from the voltage generator 130 to the strings of a selected memory block among the memory blocks of the first and the second planes 110 and 115 in response to the row address signal RADD from the control circuit 120. In other words, the operation voltages are supplied to a specific memory block selected based on the row address signal RADD.

The column selector 160 selects which page buffers of the first and the second page buffer groups 150 and 155 to output in response to the column address signal CADD from the control circuit 120. Data latched in a page buffer selected by the column selector 160 is outputted.

Although FIG. 1 illustrates one row decoder 140 and one column selector 160, a row decoder and a column selector may be provided in each plane and operations may be performed for each plane in response to a plane select signal because the semiconductor memory device according to the exemplary embodiment of this disclosure includes the first plane 110 and the second plane 115. For illustration purposes, an example is shown where the operations of the semiconductor memory device are performed for the first plane 110 and the second plane 120 in one block decoder 140 and one column selector 160.

The I/O circuit 180 outputs data received from the data transfer circuit 170 to an external circuit and transfers data from an external circuit to the data transfer circuit 170.

The P/F check circuit 190 checks whether an error cell that has a threshold voltage lower than a target threshold voltage exists in programmed memory cells and outputs a result of the check in the form of a check signal PFS. The P/F check circuit 190 performs the checking operation in a program verification operation performed after a program operation. Furthermore, the P/F check circuit 180 also counts the number of error cells and outputs a result of the count in the form of a count signal CS.

Methods of transferring data between the planes of the semiconductor memory device that has the above configuration are described below.

Figure 2:
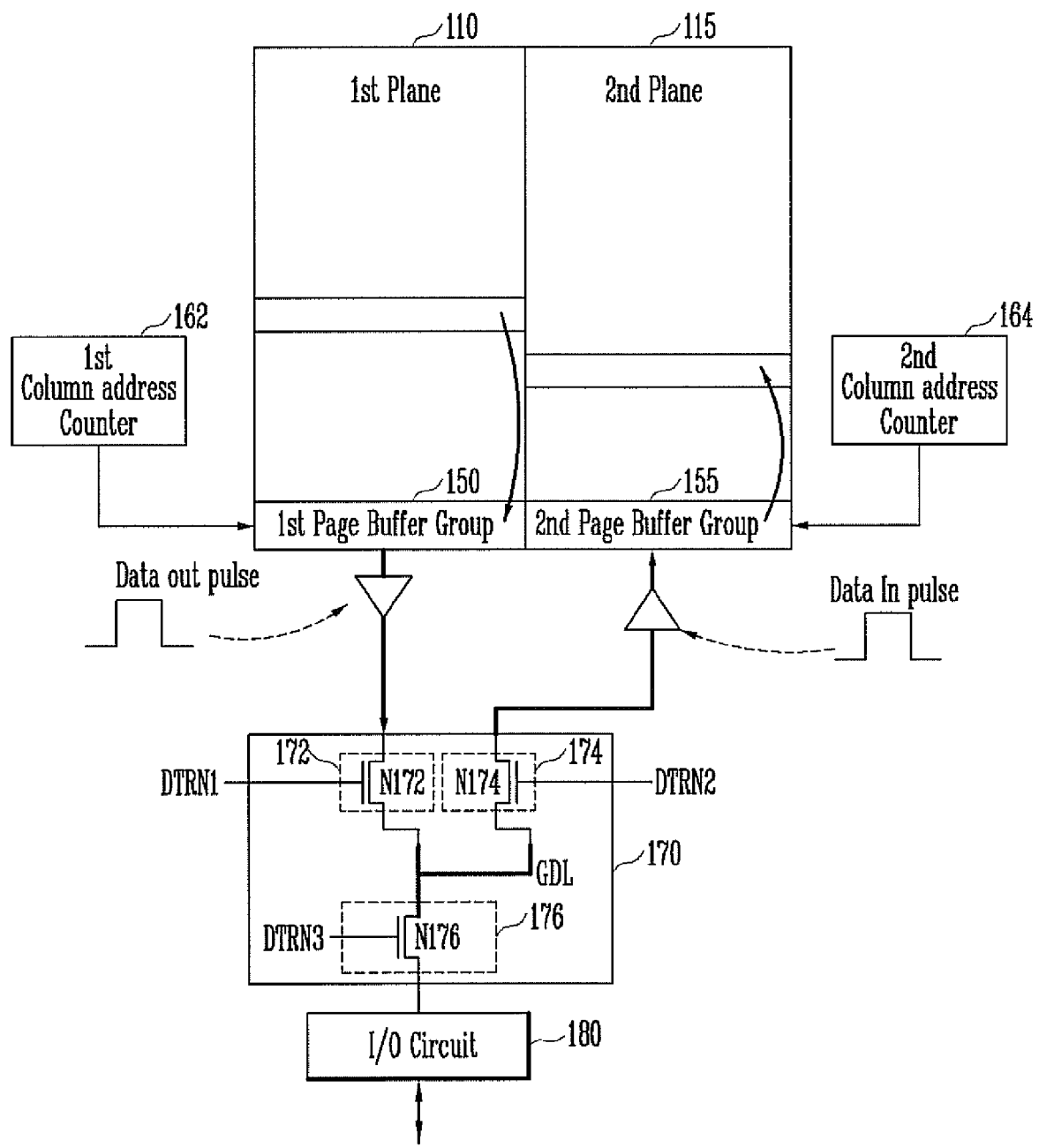
FIG. 2 is a circuit diagram illustrating a data transfer path between the planes of the semiconductor memory device of FIG. 1.
Figure 3:
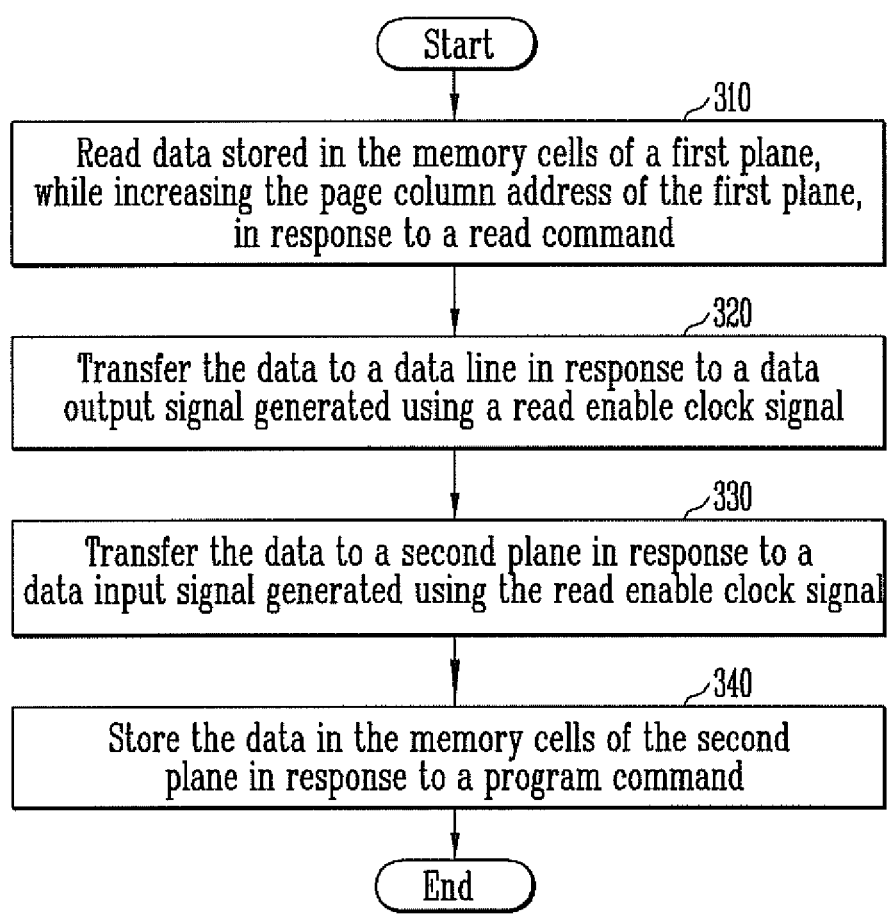
FIG. 3 is a flowchart illustrating a method of operating the semiconductor memory device according to an exemplary embodiment of this disclosure.
Figure 4:
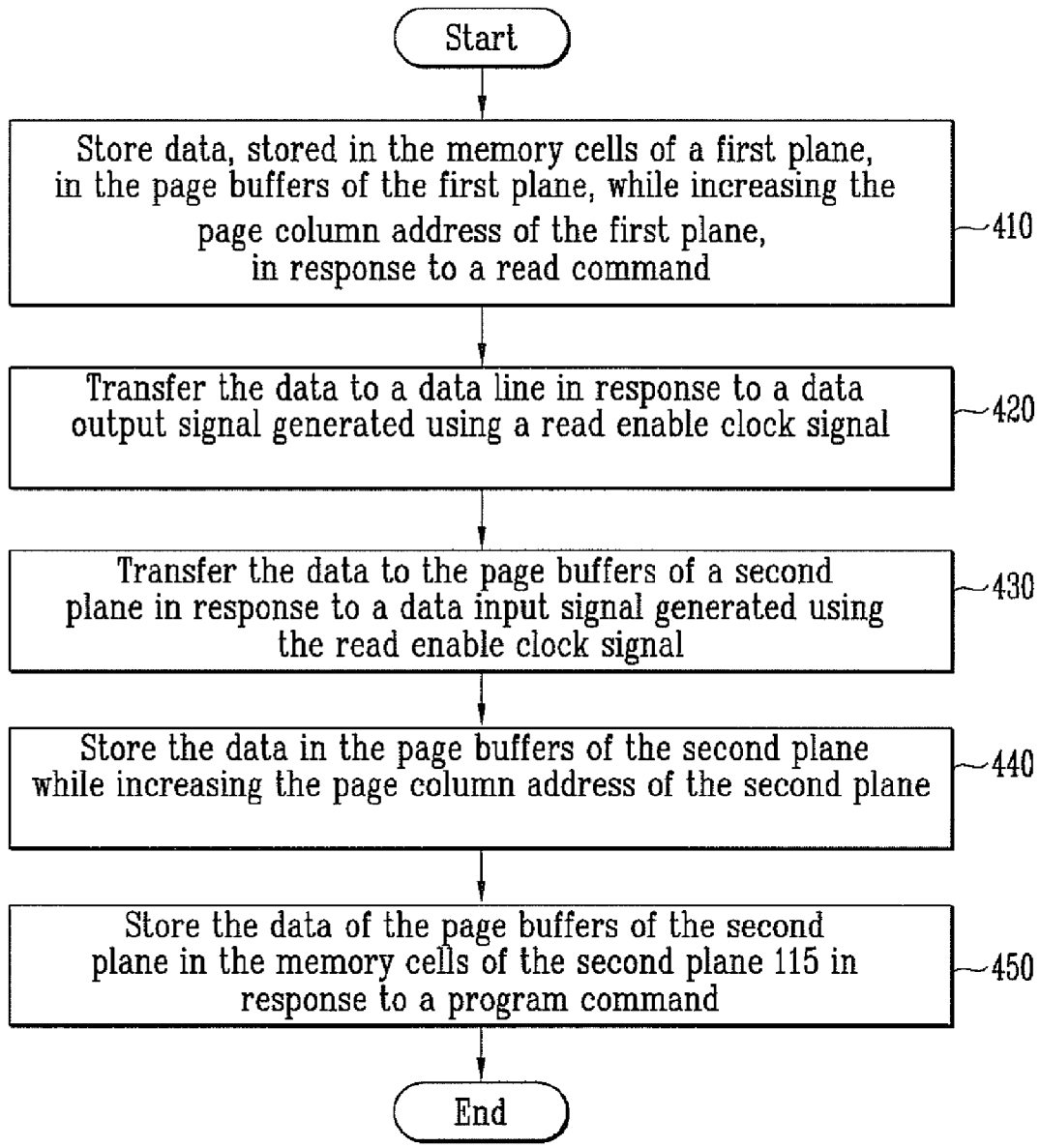
FIG. 4 is a flowchart illustrating a method of operating the semiconductor memory device according to another exemplary embodiment of this disclosure.

FIG. 2 is a circuit diagram illustrating a data transfer path between the planes of the semiconductor memory device of FIG. 1, FIG. 3 is a flowchart illustrating a method of operating the semiconductor memory device according to an exemplary embodiment of this disclosure, and FIG. 4 is a flowchart illustrating a method of operating the semiconductor memory device according to another exemplary embodiment of this disclosure.

The data transfer circuit 170 transfers first data, outputted from the first page buffer group 150, to the second page buffer group 155 to store the first data, read from the first plane 110, in the second plane 115 during a copyback operation. Alternatively, the data transfer circuit 170 also transfers second data, outputted from the second page buffer group 155, to the first page buffer group 150 to store the second data, read from the second plane 115, in the first plane 110 during a copyback operation (or a copyback program operation).

The data transfer circuit 170 includes a first data transfer unit 172, a second data transfer unit 174, and a third data transfer unit 176.

The first data transfer unit 172 includes a first switching element coupled between the first page buffer group 150 and a global data line GDL. The first switching element may be formed of a first NMOS transistor N172. The first NMOS transistor N172 is turned on when a first data transfer signal DTRAN1 is applied at a high logic level. When the first data transfer signal DTRAN1 is applied at a high logic level, the first NMOS transistor N172 transfers the data, which is outputted from the first page buffer group 150, to the I/O circuit 180 via the global data line GDL, and the first NMOS transistor N172 also transfers data, which is received from the I/O circuit 180 via the global data line GDL, to the first page buffer group 150.

The second data transfer unit 174 includes a second switching element coupled between the second page buffer group 155 and the global data line GDL. The second switching element is coupled in parallel to the first switching element. The second switching element may be formed of a second NMOS transistor N174. The second NMOS transistor N174 is turned on when a second data transfer signal DTRAN2 is applied at a high logic level. When the second data transfer signal DTRAN2 is applied at a high logic level, the second NMOS transistor N174 transfers the data, which is outputted from the second page buffer group 155, to the I/O circuit 180 via the global data line GDL, and the first NMOS transistor N174 also transfers data, which is received from the I/O circuit 180 via the global data line GDL, to the second page buffer group 155.

The third data transfer unit 176 includes a third NMOS transistor N176 coupled between the global data line GDL and the I/O circuit 180. The third data transfer unit 176 is coupled to the first data transfer unit 172 and the second data transfer unit 174. The third NMOS transistor N176 is turned on when a third data transfer signal DTRAN3 is applied at a high logic level. When the third transfer signal DTRAN3 is applied at a high logic level, the third NMOS transistor N176 transfers data, which is received from the first data transfer unit 172 or the second data transfer unit 174, to the I/O circuit 180, and the third NMOS transistor N176 also transfers data, which is received from the I/O circuit 180, to the first data transfer unit 172 or the second data transfer unit 174.

Accordingly, the first NMOS transistor N172 and the third NMOS transistor N176 are turned on when the first data transfer signal DTRN1 and the third data transfer signal DTRN3 are applied at a high logic level. By turning on the first and third NMOS transistors 172 and 176, data stored in the memory cells of the first plane 110 is outputted to an external circuit via the I/O circuit 180, or data from an external circuit received via the I/O circuit 180 is programmed into the memory cells of the first plane 110.

Furthermore, the second NMOS transistor N174 and the third NMOS transistor N176 are turned on when the second data transfer signal DTRN2 and the third data transfer signal DTRN3 are applied at a high logic level. By turning on the second and third NMOS transistors 174 and 176, data stored in the memory cells of the second plane 115 is outputted to an external circuit via the I/O circuit 180, or data from an external circuit received via the I/O circuit 180 is programmed into the memory cells of the second plane 115.

A process of transferring data between the first plane 110 and the second plane 115 through the data transfer circuit 170 constructed as above is described below. More specifically, the method described below will describe a copyback operation.

Referring to FIG. 3 and FIG. 4, first, data stored in the memory cells of the first plane 110 is read into the first page buffer group 150, while increasing the page column address of the first plane 110, in response to a read command at steps 310 and 410.

To read the stored data in the memory cells into the first page buffer group 150, the data stored in the memory cells of the first plane 110 is read into the first page buffer group 150 by performing a read operation for the memory cells of the first plane 110 in response to the read command.

Second, data stored in the first page buffer group 150 is outputted to the global data line GDL in response to a data output signal generated using a read enable clock signal at steps 320 and 420. More specifically, the data stored in the first page buffer group 150 is outputted to the first data transfer unit 172 of the data transfer circuit 170 through a first data line, and the first data transfer unit 172 transfers the received data to the global data line GDL.

To output the data stored in the first page buffer group 150 to the first data transfer unit 172 of the data transfer circuit 170, the read enable clock signal RE is toggled to generate a data output pulse signal. Subsequently, data is outputted by, for example, 1 byte while a first column address counter 162 of the column selector 160 increases the column address. When the data is outputted, the first NMOS transistor N172 of the first data transfer unit 172 is turned on when the first data transfer signal DTRN1, which is generated by the control circuit 120, is applied at a high logic level. Accordingly, the data stored in the first page buffer group 150 is transferred to the global data line GDL.

Third, the data transferred to the global data line GDL is transferred to the second page buffer group 155 of the second plane 115 in response to a data input signal generated using the read enable clock signal at steps 330 and 430. More specifically, the data transferred to the global data line GDL is transferred to the second data line of the second plane 115 through the second data transfer unit 174 of the data transfer circuit 170. The transferred data is inputted and stored in the second page buffer group 155 while increasing the page column address of the second plane 115 at step 440.

To this end, the third NMOS transistor N176 of the third data transfer unit 176 remains in an off state because the data transferred to the global data line GDL should not be outputted to an external circuit. When the second NMOS transistor N174 of the second data transfer unit 174 is turned on in response to the second data transfer signal DTRN2, which is generated by the control circuit 120, is applied at a high logic level, the data of the global data line GDL is transferred to the second data line of the second plane 115.

Subsequently, the read enable clock signal is toggled to generate the data input pulse signal of the second plane 115.

The first data is sequentially inputted to the second page buffer 155 of the second plane 115, while the second column address counter 164 increases column address.

Here, to input the first data stored in first page buffer group 150 of the first plane 110 to a specific column of the second page buffer group 155 of the second plane 115, the semiconductor memory device may use separated column address counters 162 and 164, an column address counter for the first plane 110 and the second plane 115.

Fourth, the first data inputted to the second page buffer group 155 is programmed into the memory cells of the second plane 115 in response to a program command at steps 340 and 450. To program the memory cells of the second plane 115, the first data of the second page buffer group 155 is programmed into the memory cells of the second plane 115 by performing a program operation in response to the program command.

As described above, the global data line GDL is used to output the first data from the first page buffer group 150 and to input the first data to the second page buffer group 155. Accordingly, data can be transferred from the first plane 110 to the second plane 115 by blocking the connection to an external circuit by turning off the third NMOS transistor N176.

In the exemplary embodiment of this disclosure, an example where the first data of the first plane is transferred to the second plane has been described. In some embodiments, the second data of the second plane may also be transferred to the first plane. A method of transferring the second data from the second plane 115 to the first plane 110 similar to the above method, except the data is transferred to the first plane 110 from the second plane 115.

As described above, the exemplary embodiments of this disclosure can transfer data between planes within a memory chip.

More specifically, since data can be freely transferred between planes, data does not have to be transferred to a controller. Accordingly, the amount of cache memory of the controller used is reduced, and the operating speed is increased.

The exemplary embodiment of this disclosure may be applied to all semiconductor memory fields having a structure in which memory blocks are divided into planes and the planes are independently operated.

The exemplary embodiments of this disclosure are not implemented using only the apparatus and the method, but may be implemented using a program for realizing functions corresponding to the construction of the exemplary embodiment of this disclosure or a recording medium in which the program is stored. The implementations may be readily realized by a person having ordinary skill in the art from the description of the exemplary embodiments.

What is claimed is:

1. A semiconductor memory device, comprising:
  a first plane and a second plane each comprising a plurality of memory cells;
  a first page buffer group comprising a plurality of page buffers for temporarily storing data to be stored in the memory cells of the first plane and data read from the memory cells of the first plane;
  a second page buffer group comprising a plurality of page buffers for temporarily storing data to be stored in the memory cells of the second plane and data read from the memory cells of the second plane;
  a data transfer circuit configured to transfer first data, outputted from the first page buffer group, to the second page buffer group to store the first data, stored in the memory cells of the first plane, in the second plane and to transfer second data, outputted from the second page buffer group, to the first page buffer group to store the second data, stored in the memory cells of the second plane, in the first plane when a copyback operation is performed and to transfer the first data or the second data to an I/O circuit when a read operation is performed;
  a column selector configured to select which page buffers of the first and the second page buffer groups to output in response to a column address signal,
  wherein the column selector comprises a column address counter configured to increase the column address when outputting the data stored in the first or the second page buffer group to the data transfer circuit.

2. The semiconductor memory device of claim 1, further comprising an operation circuit group for supplying an operation voltage to the first and the second plane to store data from the first and the second page buffer groups in the memory cells of the first and the second planes and to output data in the memory cells of the first and the second planes to the first and the second page buffer groups.

3. The semiconductor memory device of claim 1, wherein the data transfer circuit comprises:
  a first data transfer unit configured to transfer the first data of the first page buffer group to the I/O circuit when a read operation is performed; and
  a second data transfer unit configured to transfer the second data of the second page buffer group to the I/O circuit when a read operation is performed,
  wherein when the first data of the first page buffer group is transferred to the second page buffer group or the second data of the second page buffer group is transferred to the first page buffer group, a data transfer path is formed between the first data transfer unit and the second data transfer unit to transfer the first data or the second data between the first page buffer group and the second page buffer group.

4. The semiconductor memory device of claim 3, wherein the first data transfer unit comprises a first switching element coupled between the first page buffer group and the I/O circuit.

5. The semiconductor memory device of claim 4, wherein the second data transfer unit comprises a second switching element coupled between the second page buffer group and the I/O circuit.

6. The semiconductor memory device of claim 5, wherein the data transfer circuit further comprises a third data transfer unit for transferring the first data of the first data transfer unit or the second data of the second data transfer unit to the I/O circuit.

7. The semiconductor memory device of claim 6, wherein the third data transfer unit further comprises a third switching element coupled between the first data transfer unit and the I/O circuit and between the second data transfer unit and the I/O circuit.

8. The semiconductor memory device of claim 7, wherein the third data transfer unit blocks a connection between the first data transfer unit and the I/O circuit and between the second data transfer unit and the I/O circuit when the first data of the memory cells of the first plane is transferred to the second plane and when the second data of the memory cells of the second plane is transferred to the first plane in the copyback operation.

9. The semiconductor memory device of claim 1, wherein the data transfer circuit is configured to transfer the first data and the second data in response to a data input signal or a data output signal that is generated using a read enable clock signal.

10. A method of operating a semiconductor memory device, comprising:
   storing data, stored in memory cells of a first plane, in page buffers of the first plane in response to a read command;
   transferring the data to a data line while increasing a page column address of the first plane in response to a data output signal generated using a read enable clock signal;
   storing the data to page buffers of a second plane while increasing a page column address of the second plane in response a data input signal generated using the read enable clock signal; and
   storing the data of the page buffers of the second plane in the memory cells of the second plane in response to a program command,
   wherein the page column address of the first and the second plane is increased by a column address counter included in a column selector configured to select which page buffers of the first and the second planes when transferring the data to the data line and storing the data to the page buffers of the second plane.

11. The method of claim 10, wherein the data line is a global data line.

12. The method of claim 11, wherein when storing the data of the global data line in the page buffers of the second plane, a connection between the global data line and a circuit outside the semiconductor memory device is blocked.

* * * * *